(12) United States Patent
Chun

(10) Patent No.: US 10,276,101 B2
(45) Date of Patent: Apr. 30, 2019

(54) ORGANIC LIGHT EMITTING DISPLAY PANEL AND ORGANIC LIGHT EMITTING DISPLAY DEVICE INCLUDING THE SAME

(71) Applicant: LG Display Co., Ltd., Seoul (KR)

(72) Inventor: KwangIl Chun, Bucheon-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/858,276

(22) Filed: Dec. 29, 2017

(65) Prior Publication Data

US 2018/0190199 A1  Jul. 5, 2018

(30) Foreign Application Priority Data

Dec. 30, 2016 (KR) .................. 10-2016-0183232

(51) Int. Cl.
  *G09G 3/3258* (2016.01)
  *H01L 27/32* (2006.01)
  *G09G 3/3233* (2016.01)

(52) U.S. Cl.
  CPC ......... *G09G 3/3258* (2013.01); *G09G 3/3233* (2013.01); *H01L 27/3276* (2013.01); *G09G 2300/0819* (2013.01); *G09G 2300/0852* (2013.01); *G09G 2300/0861* (2013.01); *G09G 2310/0251* (2013.01); *G09G 2310/0264* (2013.01); *G09G 2320/043* (2013.01)

(58) Field of Classification Search
  CPC .............. G09G 3/3258; G09G 3/3233; G09G 2300/0819; G09G 2300/0852; G09G 2300/0861; G09G 2310/0251; G09G 2310/0264; G09G 2320/043; H01L 27/3276
  See application file for complete search history.

(56) References Cited

U.S. PATENT DOCUMENTS

2006/0077134 A1* 4/2006 Hector ................. G09G 3/3233
  345/76
2015/0243220 A1* 8/2015 Kim .................... H01L 27/1225
  345/215

FOREIGN PATENT DOCUMENTS

KR  10-2015-0125408 A  11/2015

* cited by examiner

*Primary Examiner* — Mark Edwards
(74) *Attorney, Agent, or Firm* — Polsinelli PC

(57) ABSTRACT

Disclosed are an organic light emitting display panel and an organic light emitting display device including the same, which decrease a level of a storage capacitance in a sampling period in which a threshold voltage of a driving transistor is sensed, and increase a level of the storage capacitance in an emission period for image display.

16 Claims, 8 Drawing Sheets

ORGANIC LIGHT EMITTING DISPLAY PANEL AND ORGANIC LIGHT EMITTING DISPLAY DEVICE INCLUDING THE SAME

CROSS-REFERENCE TO RELATED APPLICATION

This application claims the benefit of the Korean Patent Application No. 10-2016-0183232 filed on Dec. 30, 2016, which is hereby incorporated by reference in its entirety.

BACKGROUND

Field of the Disclosure

The present disclosure relates to a display device, and more particularly, to an organic light emitting display panel and an organic light emitting display device including the same.

Description of the Background

Flat panel display (FPD) devices are applied to various kinds of electronic products such as portable phones, tablet personal computers (PCs), notebook PCs, etc. Examples of the FPD devices (hereinafter referred to as a display device) include liquid crystal display (LCD) devices, organic light emitting display devices, etc. Recently, electrophoretic display devices (EPDs) are also being widely used as a type of FPD device.

As a type of FPD device (hereinafter referred to as a display device), organic light emitting display devices have a fast response time of 1 ms or less and low power consumption, and thus, are attracting much attention as next generation display devices.

FIG. 1 is an exemplary diagram illustrating a structure of a pixel applied to the related art organic light emitting display panel.

The pixel applied to the related art organic light emitting display panel, as illustrated in FIG. 1, includes a switching transistor Tsw1 which is connected to a data line DL and a gate line GL and a driving transistor Tdr which is connected between a first driving power ELVDD and an organic light emitting diode OLED and includes a gate connected to the switching transistor Tsw1. A storage capacitance Cst is provided between a second node n2 between the gate of the driving transistor Tdr and the switching transistor Tsw1 and a first node n1 between the driving transistor Tdr and the organic light emitting diode OLED.

The organic light emitting diode OLED is driven with a current which is applied thereto through an emission transistor Tsw3 for internal compensation and the driving transistor Tdr. In this case, a voltage for driving the current is supplied based on the first driving power ELVDD and a second driving power ELVSS.

In this case, when an initialization operation, a sampling operation, a data writing operation, and an emission operation are performed during two horizontal periods 2H at every frame, a threshold voltage Vth of each of pixels is compensated for, and an image is displayed based on the compensated threshold voltage.

In the above-described pixel structure, in the sampling operation, a source voltage (i.e., a voltage of the first node n1) of the driving transistor Tdr increases to a target voltage "Vg−Vth", and thus, the threshold voltage Vth of the driving transistor Tdr is sensed. Here, Vg denotes a gate voltage of the driving transistor Tdr, and Vth denotes a threshold voltage of the driving transistor Tdr.

An accuracy of the sampling operation for sensing the threshold voltage Vth is enhanced as the source voltage of the driving transistor gets closer to the target voltage.

Generally, in the organic light emitting display panel, the storage capacitance Cst is provided between the gate and the source of the driving transistor Tdr. The storage capacitor Cst is provided for minimizing an influence of noise and holding of a data voltage during one frame period. Particularly, in order to enhance a characteristic of the driving transistor Tdr, the storage capacitance Cst may be provided to have a large value.

However, if the storage capacitance Cst is provided to have a large value, it is difficult to accurately sense the threshold voltage Vth in the sampling operation of sensing the threshold voltage Vth. This is because in the sampling operation, when the source voltage of the driving transistor Tdr increases to the target voltage, a time taken in charging the source increases.

Therefore, a time taken until the source voltage of the driving transistor gets close to the target voltage increases. For this reason, in the organic light emitting display panel having a short sampling time of several µs, an accuracy of the sampling operation is reduced.

As described above, a level of the storage capacitance Cst may be set to a large value in consideration of a noise characteristic and a data voltage holding characteristic for image display, but in consideration of improvement of an accuracy of the sampling operation, a level of the storage capacitance Cst may be set to a small value.

To provide an additional description, when a level of the storage capacitance Cst increases, an accuracy of the sampling operation is reduced, and the noise characteristic and the data voltage holding characteristic for image display are enhanced.

On the other hand, when a level of the storage capacitance Cst is reduced, an accuracy of the sampling operation increases, and the noise characteristic and the data voltage holding characteristic for image display are reduced.

SUMMARY

Accordingly, the present disclosure is directed to provide an organic light emitting display panel and an organic light emitting display device including the same that substantially obviate one or more problems due to limitations and disadvantages of the related art.

An aspect of the present disclosure is directed to provide an organic light emitting display panel and an organic light emitting display device including the same, which decrease a level of a storage capacitance in a sampling period in which a threshold voltage of a driving transistor is sensed, and increase a level of the storage capacitance in an emission period for image display.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an organic light emitting display panel including a plurality of data lines, a plurality of gate lines, and a plurality of pixels defined by the plurality of data lines and the plurality of gate lines. The plurality of pixels each include an organic light emitting diode, a driving transistor including a source connected to the organic light emitting diode, an emission transistor connected between a power supply line and the driving transistor, a switching transistor connected between a corresponding data line and a gate of the driving transistor, and a capacitor unit connected between a second node connected to the gate of the driving transistor and a first node connected to the source of the driving transistor. A capacitance of the capacitor unit varies based on a storage signal.

In another aspect of the present disclosure, there is provided an organic light emitting display device including an organic light emitting display panel including a plurality of data lines, a plurality of gate lines, and a plurality of pixels defined by the plurality of data lines and the plurality of gate lines, a data driver supplying data voltages to the plurality of data lines, a gate driver supplying gate signals to the plurality of gate lines, and a controller controlling the data driver and the gate driver. The plurality of pixels each include an organic light emitting diode, a driving transistor including a source connected to the organic light emitting diode, an emission transistor connected between a power supply line and the driving transistor, a switching transistor connected between a corresponding data line and a gate of the driving transistor, and a capacitor unit connected between a second node connected to the gate of the driving transistor and a first node connected to the source of the driving transistor. A capacitance of the capacitor unit varies based on a storage signal input from the gate driver.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings.

DETAILED DESCRIPTION

Figure 1:
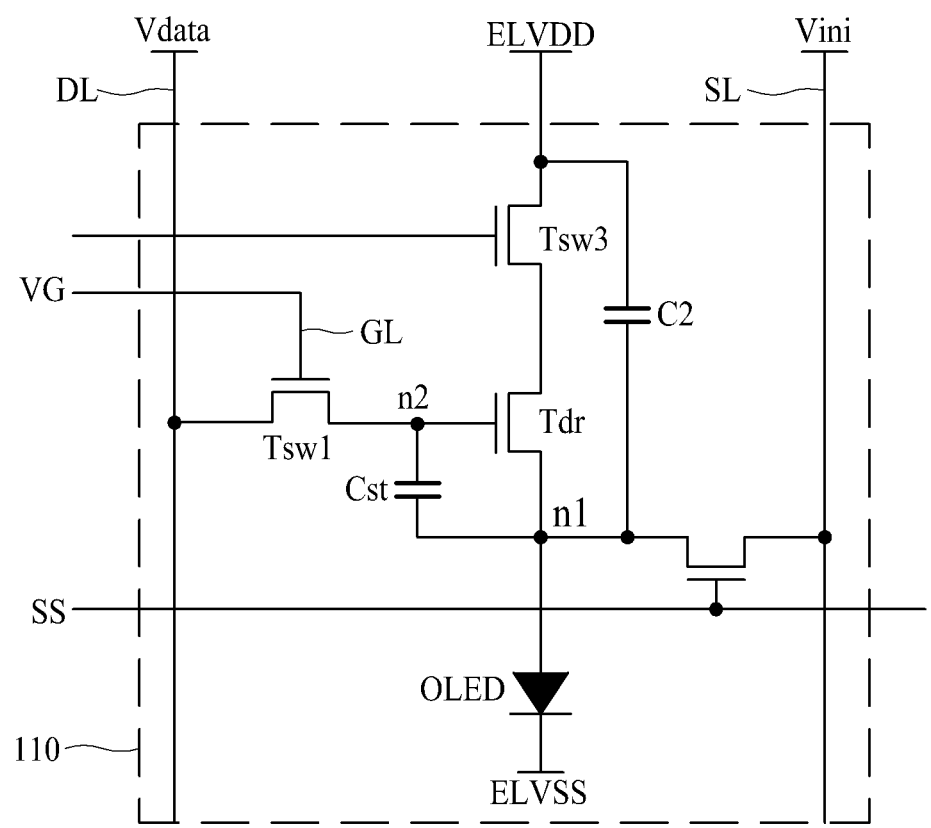
FIG. 1 is an exemplary diagram illustrating a structure of a pixel applied to the related art organic light emitting display panel.

Reference will now be made in detail to the exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Furthermore, the present disclosure is only defined by scopes of claims.

In the specification, in adding reference numerals for elements in each drawing, it should be noted that like reference numerals already used to denote like elements in other drawings are used for elements wherever possible.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various aspects of the present disclosure may be partially or overall coupled to or combined with each other, and may be variously inter-operated with each other and may be driven technically as those skilled in the art can sufficiently understand. The aspects of the present disclosure may be carried out independently from each other, or may be carried out together in co-dependent relationship.

Hereinafter, aspects of the present disclosure will be described in detail with reference to the accompanying drawings.

Figure 2:
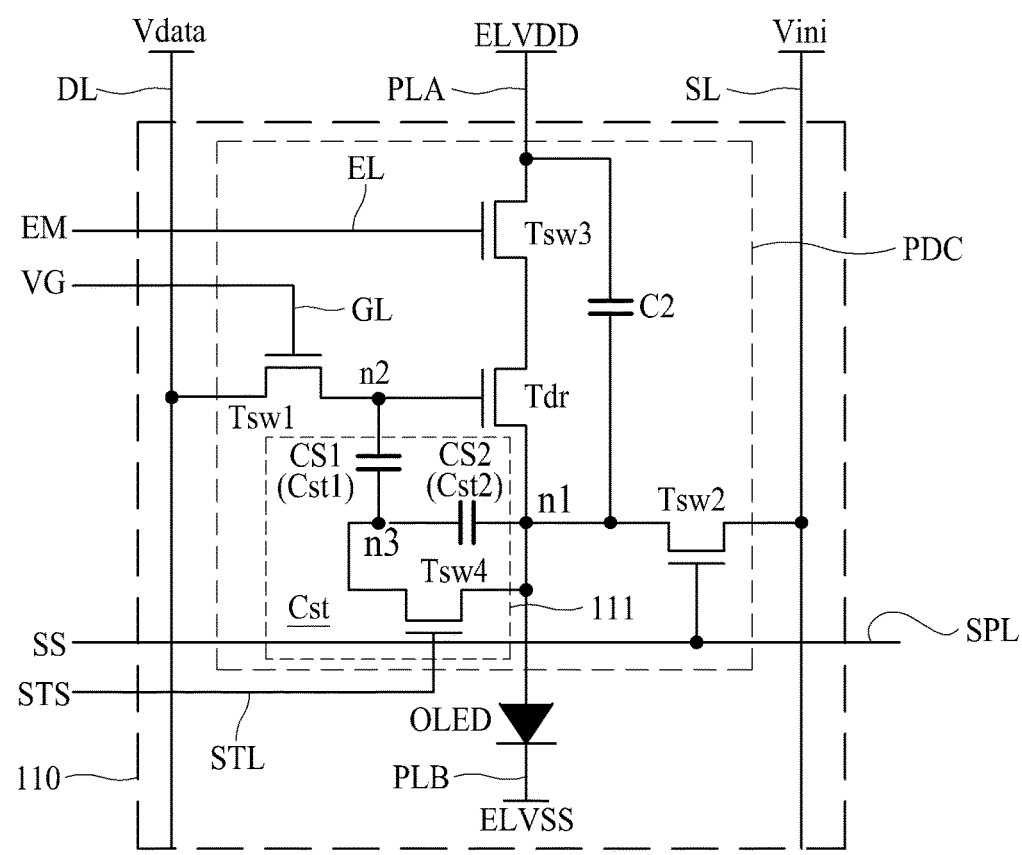
FIG. 2 is an exemplary diagram illustrating a configuration of an organic light emitting display panel according to an aspect of the present disclosure.

FIG. 2 is an exemplary diagram illustrating a configuration of an organic light emitting display panel according to an aspect of the present disclosure.

The organic light emitting display panel according to an aspect of the present disclosure may include a plurality of gate lines GL through which a gate signal VG is supplied, a plurality of data lines DL through which data voltages Vdata are respectively supplied, and a plurality of pixels 110 defined at the intersections of the gate lines GL and the data line DL.

The pixels 110, as illustrated in FIG. 2, may each include an organic light emitting diode OLED emitting light and a pixel driver PDC for driving the organic light emitting diode OLED.

A plurality of signal lines DL, EL, GL, PLA, PLB, SL, and SPL for supplying a plurality of driving signals to the pixel driver PDC may be provided in each of the pixels 110.

A data voltage Vdata may be supplied through a data line DL, a gate pulse or a gate low signal may be supplied through a gate line GL, a first driving power ELVDD may be supplied through a power supply line PLA, a second driving power ELVSS may be supplied through a driving power line PLB, an initialization voltage Vini may be supplied through a sensing line SL, a sensing control signal SS for turning on a sensing transistor Tsw2 may be supplied through a sensing pulse line SPL, an emission control signal EM for driving an emission transistor Tsw3 may be supplied through an emission line EL, and a storage signal STS for driving a storage transistor Tsw4 may be supplied through a storage line STL. In this case, the sensing pulse line SPL and the gate line GL may be provided as one line. For example, the gate signal supplied to a switching transistor Tsw1 through the gate line GL may be input to a gate of the sensing transistor Tsw2.

For example, as illustrated in FIG. 2, the pixel driver PDC may include a driving transistor Tdr including a source connected to the organic light emitting diode OLED, the emission transistor Tsw3 connected between the power supply line PLA and the driving transistor Tdr, the switching transistor Tsw1 connected between the data line DL and a gate of the driving transistor Tdr, and a capacitor unit 111 connected between a second node n2 connected to the gate of the driving transistor Tdr and a first node n1 connected to the source of the driving transistor Tdr. A capacitance of the capacitor unit 111 may be referred to as a storage capacitance Cst between the first node n1 and the second node n2.

The storage capacitance Cst of the capacitor unit 111 may vary according to the storage signal STS.

To this end, the capacitor unit 111 may include a first storage capacitor CS1 which is connected to the second node n2 at one side of the first storage capacitor CS1, a second storage capacitor CS2 which is connected to the other side of the first storage capacitor CS1 at one side of the second storage capacitor CS2 and is connected to the first node n1 at the other side, and the storage transistor Tsw4 which is connected between the first node n1 and a third node n3 connected to the first storage capacitor CS1 and the second storage capacitor CS2.

A capacitance generated by the first storage capacitor CS1 may be referred to as a first storage capacitance Cst1, and a capacitance generated by the second storage capacitor CS2 may be referred to as a second storage capacitance Cst2.

The switching transistor Tsw1 may be turned on by the gate pulse supplied through the gate line GL and may transfer the data voltage Vdata, supplied through the data line DL, to the gate of the driving transistor Tdr.

The sensing transistor Tsw2 may be connected to the sensing line SL and the first node n1 between the driving transistor Tdr and the organic light emitting diode OLED and may be turned on by a sensing pulse included in the sensing control signal SS to sense a characteristic of the driving transistor Tdr.

The second node n2 connected to the gate of the driving transistor Tdr may be connected to the switching transistor Tsw1.

The emission transistor Tsw3 may be turned on or off by the emission control signal EM to transfer the first driving power ELVDD to the driving transistor Tdr or cut off the first driving power ELVDD. When the emission transistor Tsw3 is turned on, a current may be supplied to the driving transistor Tdr, and thus, the organic light emitting diode OLED may emit light.

Figure 3:
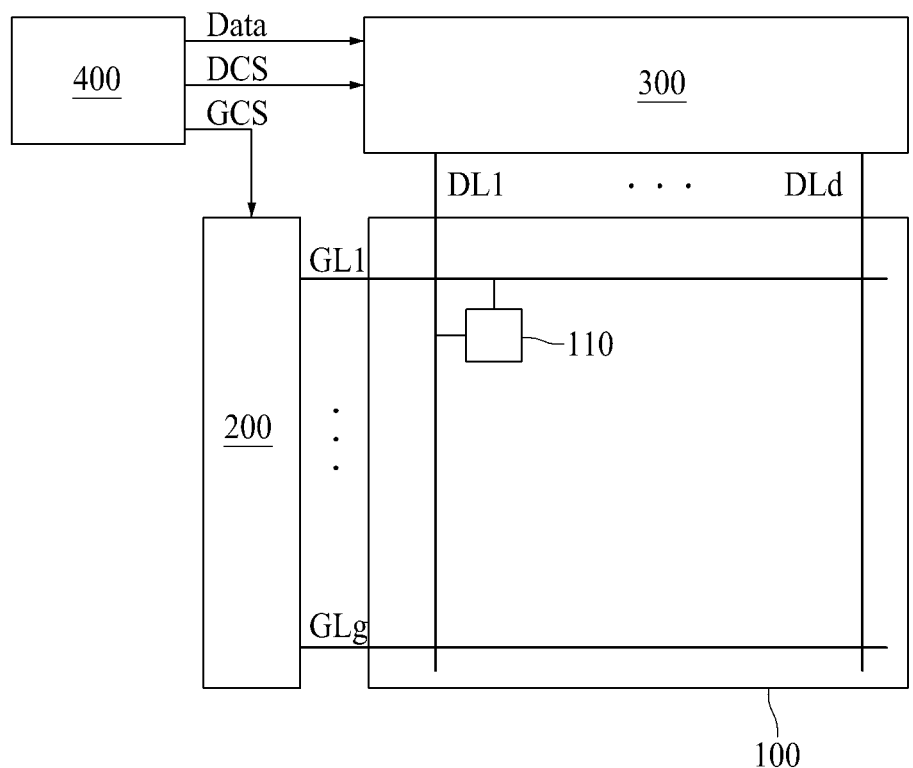
FIG. 3 is an exemplary diagram of an organic light emitting display device according to an aspect of the present disclosure.

In addition to the elements illustrated in FIG. 3, various elements may be added to the pixel driver PDC.

In an aspect of the present disclosure, as described above, the storage capacitance Cst of the capacitor unit 111 may vary according to the storage signal STS.

Hereinafter, an organic light emitting display device according to an aspect of the present disclosure will be described with reference to FIGS. 3 to 8, and particularly, a method of varying the storage capacitance Cst will be described.

FIG. 3 is an exemplary diagram of an organic light emitting display device according to an aspect of the present disclosure. In the following description, details which are the same as or similar to details described above with reference to FIG. 2 are omitted or will be briefly described.

The organic light emitting display device according to an aspect of the present disclosure, as illustrated in FIGS. 2 and 3, may include an organic light emitting display panel 100 which includes a plurality of data lines DL1 to DLd, a plurality of gate lines GL1 to GLg, and a plurality of pixels 110 defined at the intersections of the data lines DL1 to DLd and the gate lines GL1 to GLg, a data driver 300 that supplies data voltages Vdata to the data lines DL1 to DLd, a gate driver 200 that supplies gate signals to the gate lines GL1 to GLg, and a controller 400 that controls the gate driver 200 and the data driver 300.

First, as described above, the organic light emitting display panel 100 may include a plurality of pixels 110, and each of the pixels 110 may include an organic light emitting diode OLED and a pixel driver PDC.

For example, as illustrated in FIG. 2, the pixel driver PDC may include a driving transistor Tdr including a source connected to the organic light emitting diode OLED, an emission transistor Tsw3 connected between the power supply line PLA and the driving transistor Tdr, a switching transistor Tsw1 connected between the data line DL and a gate of the driving transistor Tdr, and a capacitor unit 111 connected between a second node n2 connected to the gate of the driving transistor Tdr and a first node n1 connected to the source of the driving transistor Tdr.

The storage capacitance Cst of the capacitor unit 111 may vary according to the storage signal STS.

To this end, the capacitor unit 111 may include a first storage capacitor CS1 which is connected to the second node n2 at one side of the first storage capacitor CS1, a second storage capacitor CS2 which is connected to the other side of the first storage capacitor CS1 at one side of the second storage capacitor CS2 and is connected to the first node n1 at the other side, and a storage transistor Tsw4 which is connected between the first node n1 and a third node n3 connected to the first storage capacitor CS1 and the second storage capacitor CS2.

The switching transistor Tsw1 may perform a function of addressing a data voltage Vdata according to a gate pulse.

The sensing transistor Tsw2 may perform an initialization operation.

The emission transistor Tsw3 may perform a compensation and emission function.

The storage transistor Tsw4 may selectively control the storage capacitance Cst of the capacitor unit 111. A level of the storage capacitance Cst of the capacitor unit 111 may vary by changing the storage signal STS supplied to the gate of the storage transistor Tsw4.

The driving transistor Tdr may control a level of a current transferred to the organic light emitting diode OLED.

The first storage capacitor CS1 may hold a data voltage during a certain period.

The second capacitor CS2 may be used in a sampling period for sensing a threshold voltage Vth of the driving transistor Tdr.

The storage capacitance Cst of the capacitor unit 111 may be a capacitance between the first node n1 and the second node n2. The storage capacitance Cst may be the first capacitance Cst1 based on the first storage capacitor CS1, or may be a node capacitance $(=(Cst1 \times Cst2)/(Cst1+Cst2))$ based on the first and second storage capacitors CS1 and CS2 serially connected to each other.

In this case, a level of the first capacitance Cst1 based on the first storage capacitor CS1 may be higher than that of a second capacitance based on the second capacitor CS2.

Moreover, a level of the first capacitance Cst1 based on the first storage capacitor CS1 may be higher than that of the node capacitance $(=(Cst1 \times Cst2)/(Cst1+Cst2))$.

The controller 400 may output a gate control signal GCS for controlling the gate driver 200 and a data control signal DCS for controlling the data driver 300 by using a timing signal (for example, a vertical sync signal, a horizontal sync signal, and a clock) supplied from an external system. The controller 400 may sample input video data received from the external system, realign the input video data to generate digital image data Data, and supply the digital image data Data to the data driver 300.

The data driver 300 may convert the image data Data input from the controller 400 into data voltages Vdata and may transfer the data voltages Vdata for one horizontal line to the data lines DL1 to DLd at every one horizontal period in which the gate pulse is supplied to one gate line GL.

The data driver 300 may transfer the initialization voltage Vini to the sensing transistor Tsw2.

In response to the gate control signal input from the controller 400, the gate driver 200 may sequentially supply the gate pulse to the gate lines GL1 to GLg of the organic light emitting display panel 100. Therefore, transistors provided in each of the pixels 110 supplied with the gate pulse may be turned on, and thus, a signal corresponding to an image may be output to each pixel 110.

Moreover, the gate driver 200 may output the emission control signal EM to a gate of the emission transistor Tsw3. The emission transistor Tsw3 may be turned on or off by the emission control signal EM.

Moreover, the gate driver 200 may output the storage signal STS to a gate of the storage transistor Tsw4. The storage transistor Tsw4 may be turned on or off by the storage signal STS.

Moreover, the gate driver 200 may output the sensing control signal SS to a gate of the sensing transistor Tsw2. The sensing transistor Tsw2 may be turned on or off by the sensing control signal SS.

The gate driver 200 may generate the gate signal VG, the emission control signal EM, and the storage signal STS from the gate control signal GCS supplied from the controller 400 and other various signals.

The gate driver 200 may be provided independently from the organic light emitting display panel 100 and may be electrically connected to the organic light emitting display panel 100 in various types, but may be implemented as a gate in panel (GIP) type which is embedded in the organic light emitting display panel 100.

Hereinabove, it has been described that each of the data driver 300, the gate driver 200, and the controller 400 is independently provided, but at least one of the data driver 300 and the gate driver 200 may be provided as one body with the controller 400.

Figure 4:
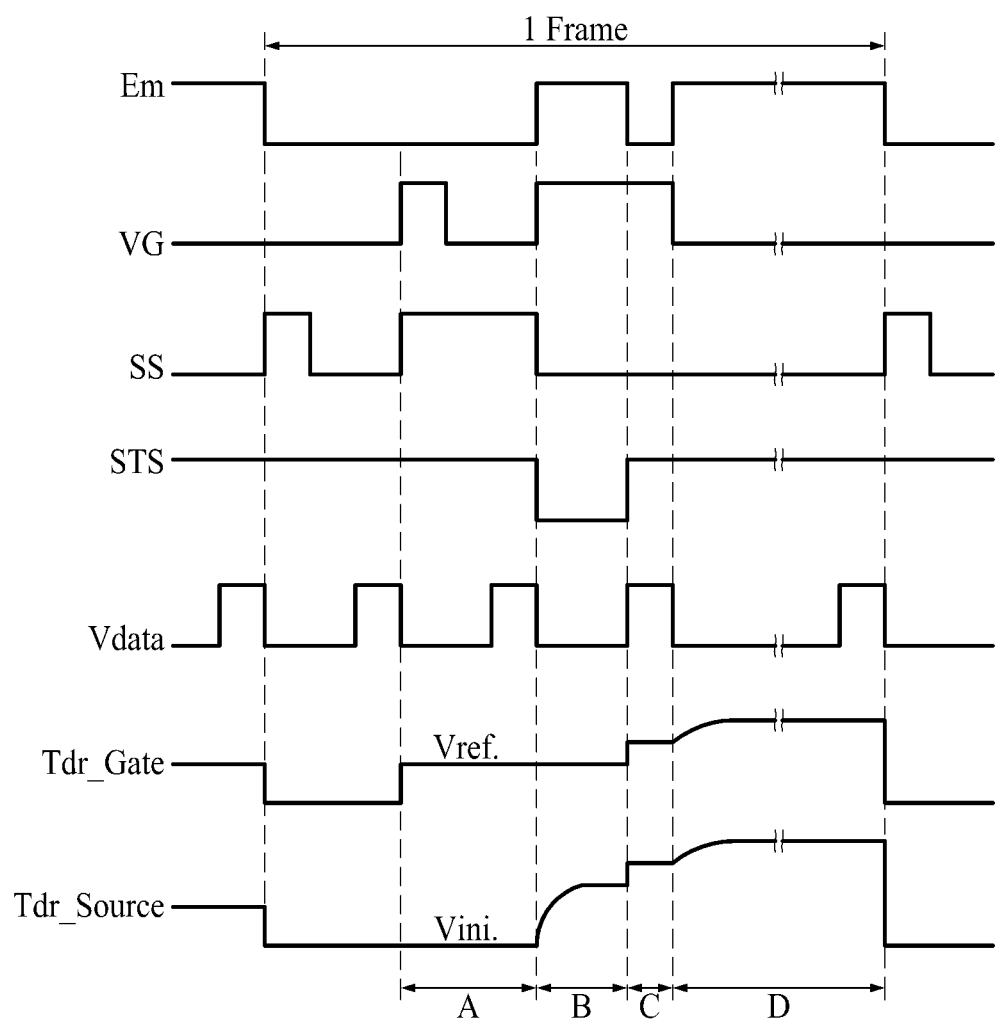
FIG. 4 is a waveform diagram for describing a driving method of an organic light emitting display device according to an aspect of the present disclosure.
Figure 5:
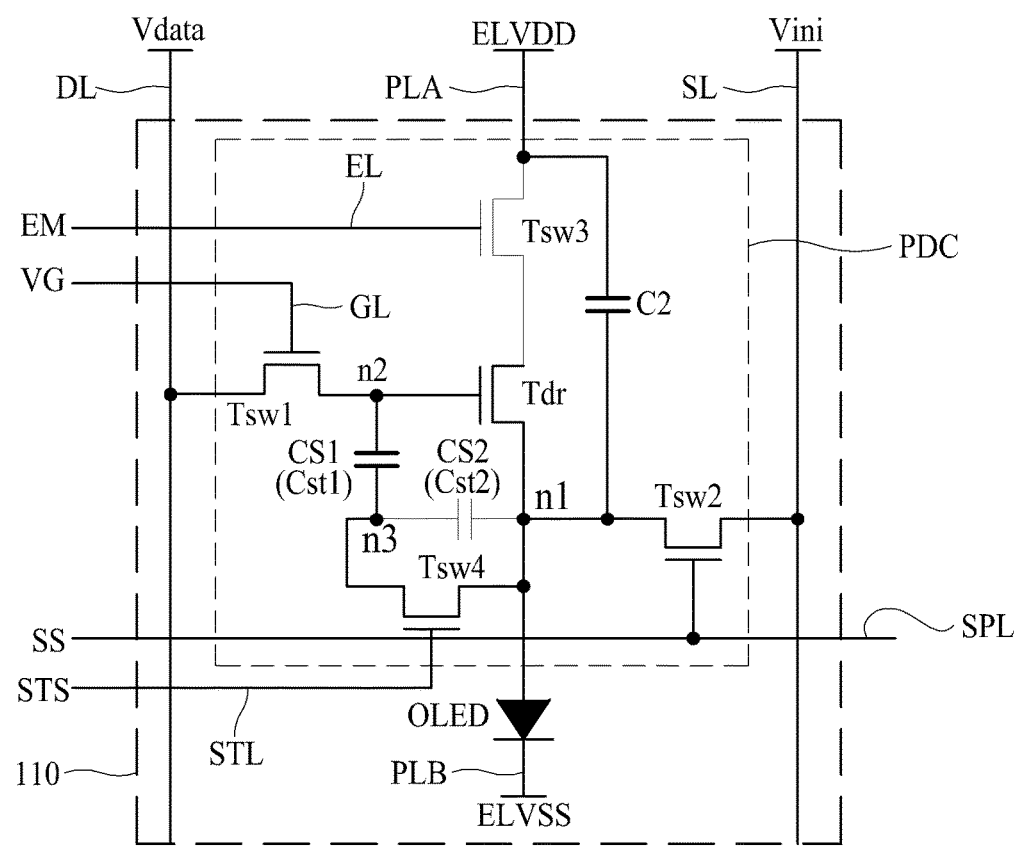
FIG. 5 is a circuit diagram illustrating a pixel driver in an initialization period in an organic light emitting display device according to an aspect of the present disclosure.
Figure 6:
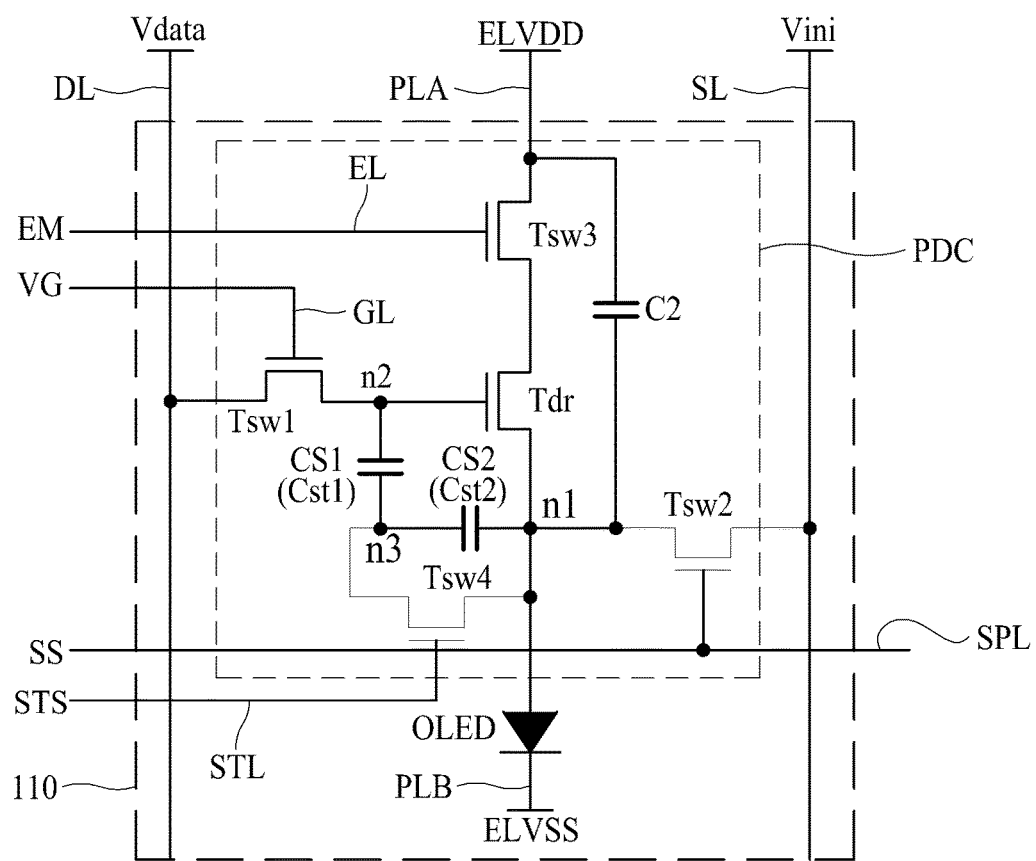
FIG. 6 is a circuit diagram illustrating a pixel driver in a sampling period in an organic light emitting display device according to an aspect of the present disclosure.
Figure 7:
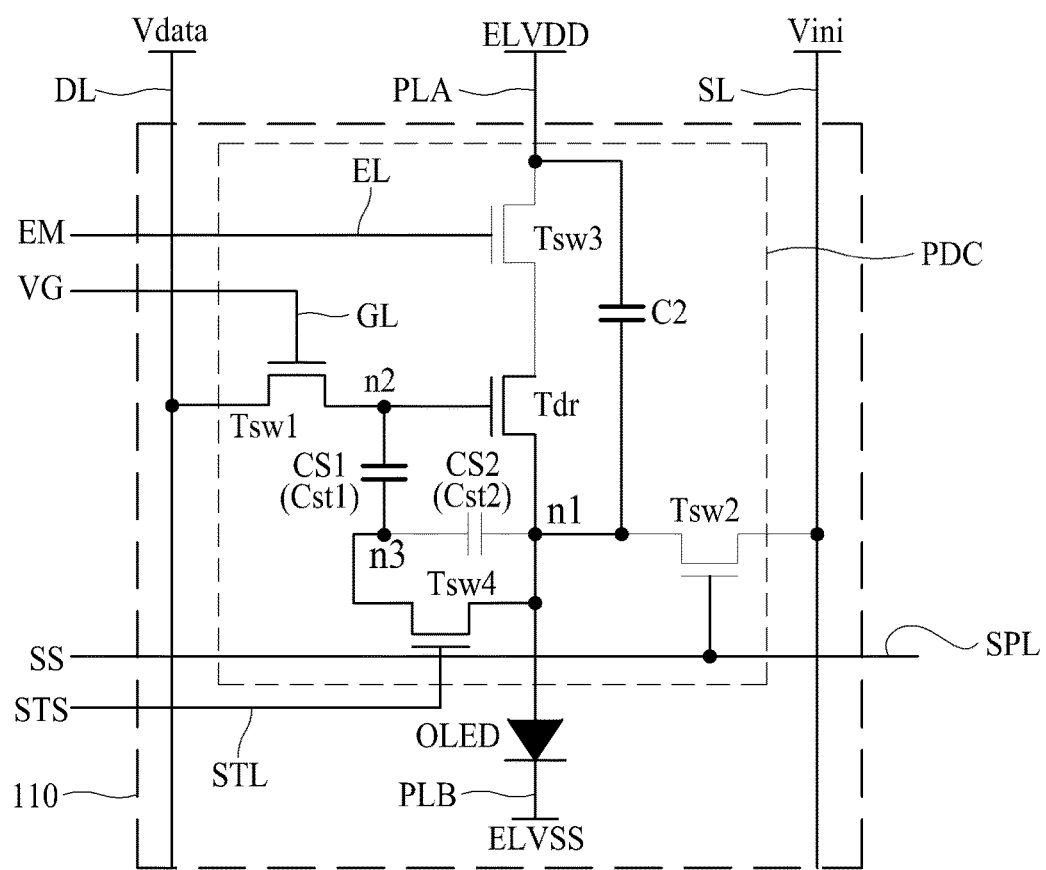
FIG. 7 is a circuit diagram illustrating a pixel driver in a data writing period in an organic light emitting display device according to an aspect of the present disclosure.
Figure 8:
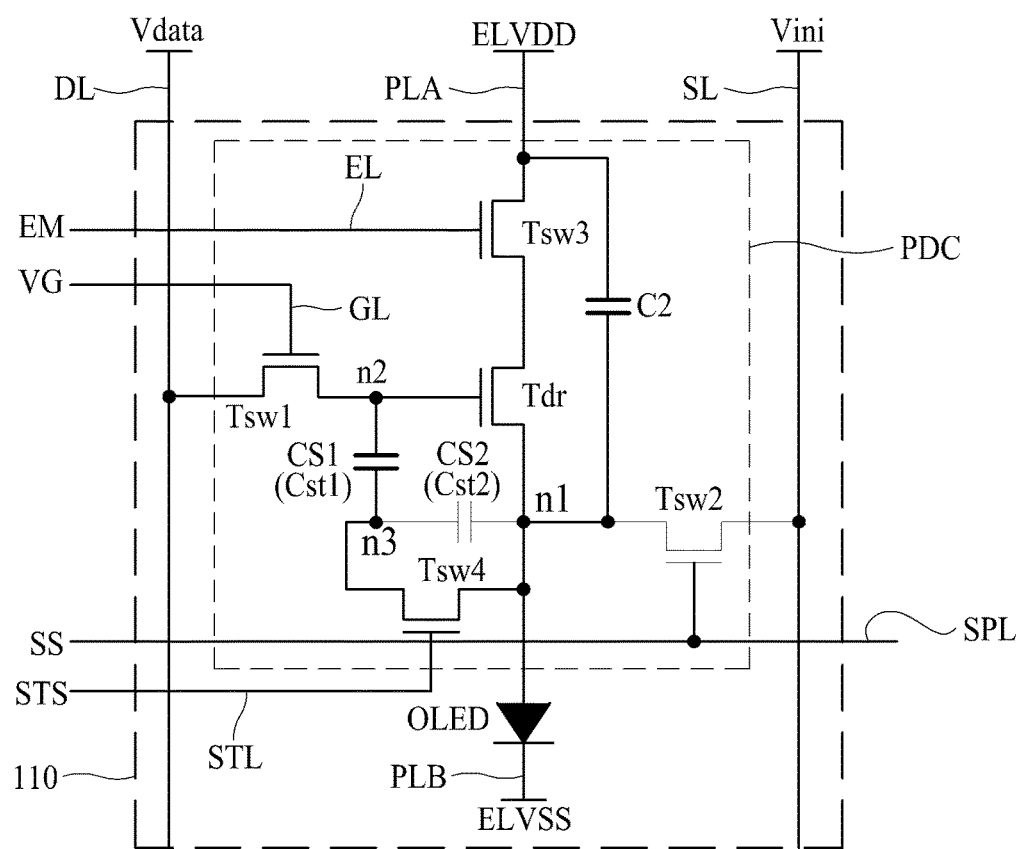
FIG. 8 is a circuit diagram illustrating a pixel driver in an emission period in an organic light emitting display device according to an aspect of the present disclosure.

FIG. 4 is a waveform diagram for describing a driving method of an organic light emitting display device according to an aspect of the present disclosure. FIG. 5 is a circuit diagram illustrating a pixel driver in an initialization period in an organic light emitting display device according to an aspect of the present disclosure. FIG. 6 is a circuit diagram illustrating a pixel driver in a sampling period in an organic light emitting display device according to an aspect of the present disclosure. FIG. 7 is a circuit diagram illustrating a pixel driver in a data writing period in an organic light emitting display device according to an aspect of the present disclosure. FIG. 8 is a circuit diagram illustrating a pixel driver in an emission period in an organic light emitting display device according to an aspect of the present disclosure.

Hereinabove, the organic light emitting display device including the organic light emitting display panel 100 described above with reference to FIG. 2 needs signals having waveforms shown in FIG. 4, for driving the pixel driver PDC.

For example, an initialization operation, a sampling operation, and a data writing operation may be sequentially executed according to the signals during two horizontal periods 2H at every frame, and then, an emission operation may be executed. Therefore, a period in which the initialization operation, the sampling operation, the data writing operation, and the emission operation are performed may be variously changed based on a whole structure and a driving method of the organic light emitting display device.

An image may be displayed in a state where an influence of the threshold voltage Vth of the driving transistor Tdr included in the pixel driver PCD of each pixel is removed by the operations.

A period in which the initialization operation is performed may be referred to as an initialization period A, a period in which the sampling operation is performed may be referred to as a sampling period B, a period in which the data writing operation is performed may be referred to as a data writing period C, and a period in which the emission operation is performed may be referred to as an emission period D.

A basic function performed in each of the periods will be briefly described below.

In the initialization period A, a function of initializing the pixel driver PDC may be performed for compensating for the threshold voltage of the driving transistor Tdr. To this end, in the initialization period A, a reference voltage Vref and the initialization voltage Vini may be supplied to the gate and the source of the threshold voltage Tdr.

In the sampling period B, the threshold voltage Vth of the driving transistor Tdr may be detected. In the sampling period B, the threshold voltage Vth of the driving transistor Tdr may be stored in the capacitor unit 111. In an aspect of the present disclosure, the threshold voltage Vth of the driving transistor Tdr may be stored in the first and second storage capacitors CS1 and CS2 serially connected to each other.

In the data writing period C, a current flowing to the organic light emitting diode OLED may be determined. To this end, a data voltage Vdata may be supplied to the gate of the driving transistor Tdr. In this case, due to the operation performed in the sampling period B, the current flowing to the organic light emitting diode OLED may be determined irrespective of the threshold voltage Vth.

In the emission period D, the organic light emitting diode OLED may emit light. In this case, a luminance of the light emitted from the organic light emitting diode OLED may be proportional to a level of the current flowing to the organic light emitting diode OLED. A most time of one frame period may be included in the emission period D.

Hereinafter, a driving method of the organic light emitting display device according to an aspect of the present disclosure described above with reference to FIGS. 4 to 8 will be described.

First, in the initialization period A, as illustrated in FIG. 5, when the emission transistor Tsw3 is turned off and the storage transistor Tsw4 is turned on, the first storage capacitance Cst1 based on the first storage capacitor CS1 may be provided between the second node n2 and the first node n1. That is, in the initialization period A, the first storage capacitance Cst1 may constitute a storage capacitance Cst between the first node n1 and the second node n2.

To this end, as shown in FIG. 4, the emission control signal EM having a low value may be supplied to the emission transistor Tsw3, the storage signal STS having a high value may be supplied to the storage transistor Tsw4, the sensing control signal SS having a high value may be supplied to the sensing transistor Tsw2, and the gate pulse having a high value may be supplied to the driving transistor Tdr. In this case, the sensing transistor Tsw2 may be turned on, and thus, the initialization voltage Vini may be supplied to the first node n1.

Since the storage transistor Tsw4 is turned on, only the first storage capacitance Cst1 may be substantially provided between the first node n1 and the second node n2.

In this case, the initialization voltage Vini input through the sensing line SL may be supplied to the source (i.e., the first node n1) of the driving transistor Tdr. Also, the reference voltage Vref input through the data line DL may be supplied to the gate (i.e., the second node n2) of the driving transistor Tdr.

In the initialization period A, the storage capacitance Cst may be high.

To this end, in an aspect of the present disclosure, the storage transistor Tsw4 may be turned on, and thus, the first storage capacitance Cst1 may become the storage capacitance Cst.

Second, in the sampling period B, as illustrated in FIG. 6, when the emission transistor Tsw3 is turned on and the storage transistor Tsw4 is turned off, the node capacitance $(=(Cst1 \times Cst2)/(Cst1+Cst2))$ based on the first and second storage capacitors CS1 and CS2 serially connected to each other may be provided between the second node n2 and the first node n1. In this case, the sensing transistor Tsw2 may be turned off.

As described above, in the sampling period B, the threshold voltage Vth of the driving transistor Tdr may be detected. In the sampling period B, the threshold voltage Vth of the driving transistor Tdr may be stored in the first and second storage capacitors CS1 and CS2 serially connected to each other.

To provide an additional description, as shown in FIG. 4, in the initialization period A, the reference voltage Vref may be supplied to the second node n2 (i.e., the gate of the driving transistor Tdr), and the initialization voltage Vini may be supplied to the first node n1 (i.e., the source of the driving transistor Tdr).

In the sampling period B, the sensing transistor Tsw2 may be turned off, and thus, the first node n1 may be floated, whereby a voltage of the first node n1 may increase with time.

In this case, the voltage of the first node n1 may increase until a voltage difference between the second node n2 and the first node n1 becomes the threshold voltage Vth of the driving transistor Tdr.

Therefore, at a last timing of the sampling period B, a difference voltage (=Vref−Vth) between the reference voltage Vref and the threshold voltage Vth of the driving transistor Tdr may be charged into the first node n1, and the reference voltage Vref may be changed into the second node n2.

Therefore, at the last timing of the sampling period B, a difference voltage (Vgs=Vref−(Vref−Vth)) between the gate and the source of the driving transistor Tdr may become the threshold voltage Vth of the driving transistor Tdr.

When a level of the storage capacitance Cst is low, the voltage of the first node n1 increases quickly.

To this end, as described above, the storage transistor Tsw4 may be turned off, and thus, the node capacitance $(=(Cst1 \times Cst2)/(Cst1+Cst2))$ based on the first and second storage capacitors CS1 and CS2 serially connected to each other may be provided between the second node n2 and the first node n1.

That is, as a level of the storage capacitance Cst is reduced, a charging speed of the source (i.e., the first node n1) is enhanced. Accordingly, a performance of the sampling operation is enhanced.

Third, in the data writing period C, as illustrated in FIG. 7, when the emission transistor Tsw3 is turned off and the storage transistor Tsw4 is turned on, the first storage capacitance Cst1 based on the first storage capacitor CS1 may be provided between the second node n2 and the first node n1. That is, the storage capacitance Cst between the second node n2 and the first node n1 may become the first storage capacitance Cst1. In this case, the sensing transistor Tsw2 may be turned off.

Therefore, a level of the storage capacitance Cst (i.e., a level of the first storage capacitance Cst1) in the data writing period C may be higher than that of the storage capacitance Cst (i.e., the node capacitance $(=Cst1 \times Cst2)/(Cst1+Cst2))$) in the sampling period B.

Since a level of the storage capacitance Cst in the data writing period C is higher than that of the storage capacitance Cst in the sampling period B, a data voltage Vdata supplied through the data line DL may be sufficiently charged into the capacitor unit 111.

In this case, a voltage of the second node n2 may increase to the data voltage Vdata.

Moreover, the voltage of the first node n1 may increase a little more than the difference voltage (=Vref−Vth) between the reference voltage Vref and the threshold voltage Vth.

For example, the voltage of the first node n1 may become [(Vref−Vth]+[C'×(Vdata−Vref)], and thus, may increase [C'×(Vdata−Vref)] more than the difference voltage (=Vref−Vth) between the reference voltage Vref and the threshold voltage Vth.

Here, [C'×(Vdata−Vref)] may be a voltage which is coupled to the first node n1 according to a variation of the voltage Vdata applied to the second node n2. In the equation, C' may be [Cst1/(Cst1+Cst2)].

In this case, the difference voltage between the second node n2 and the first node n1 (i.e., the difference voltage Vgs between the gate and the source of the driving transistor Tdr) may be [Vdata−{(Vref−Vth)+C'(Vdata−Vref)}=(Vdata−Vref)×(1−C')+Vth].

However, a level of the storage capacitance Cst in the data writing period C may not be high, based on a structure and a driving method of the organic light emitting display device. In this case, a level of the storage capacitance Cst in the data writing period C may be equal to that of the storage capacitance Cst in the sampling period B. To this end, the storage transistor Tsw4 may be turned off even in the data writing period C.

That is, in the data writing period C, the storage capacitance Cst may be provided to have a high value or a low value.

Fourth, in the emission period D, when the emission transistor Tsw3 is turned on and the storage transistor Tsw4 is turned on, the first storage capacitance Cst1 based on the first storage capacitor CS1 may be provided between the second node n2 and the first node n1. That is, the storage capacitance Cst between the second node n2 and the first node n1 may become the first storage capacitance Cst1. In this case, the sensing transistor Tsw2 may be turned off.

As described above, in the sampling period B in which the threshold voltage Vth of the driving transistor Tdr is sensed, a node capacitance based on a serial connection between the first storage capacitor CS1 and the second storage capacitor CS2 may be provided between the first node n1 and the second node n2, and in the emission period D in which an image is displayed, the first storage capacitance Cst1 based on the first storage capacitor CS1 may be provided.

The first storage capacitance Cst1 may be higher than the node capacitance (=(Cst1×Cst2)/(Cst1+Cst2)).

In the emission period D, the first node n1 and the second node n2 may be boosted by the first driving power ELVDD, and thus, the voltage of each the first node n1 and the second node n2 may increase.

However, the difference voltage between the second node n2 and the first node n1 (i.e., the difference voltage Vgs between the gate and the source of the driving transistor Tdr) may still be [(Vdata−Vref)×(1−C')+Vth=Vdata−Vref−(Vdata×C')+(Vref×C')+Vth=Vdata+K+Vth]. Here, K may be [−Vref−(Vdata×C')+(Vref×C')]. That is, since Vref and C have values which are previously known, K may be a constant.

A brightness of the organic light emitting diode OLED may be proportional to a current Ioled flowing in the organic light emitting diode OLED as in the following Equation (1). The current Ioled flowing in the organic light emitting diode OLED may depend on the difference voltage Vgs of the driving transistor Tdr and the threshold voltage Vth of the driving transistor Tdr. That is, the current Ioled flowing in the organic light emitting diode OLED may depend on (Vgs−Vth)²:

$$I_{OLED} = \frac{1}{2} \times \mu \times \frac{W}{L} \times C_{GI} \times (V_{GS} - V_{TH})^2 \quad (1)$$

where ti denotes a mobility of the driving transistor Tdr, $C_{GI}$ denotes a parasitic capacitance of the driving transistor Tdr, W denotes a channel width of the driving transistor Tdr, L denotes a channel length of the driving transistor Tdr, $V_{GS}$ denotes a difference voltage between a gate voltage and a source voltage of the driving transistor Tdr, and $V_{TH}$ denotes the threshold voltage of the driving transistor Tdr.

In the emission period D, as described above, the difference voltage Vgs between a gate voltage and a source voltage of the driving transistor Tdr may become [Vdata+Vth+K].

In this case, a difference value "Vgs−Vth" between the difference voltage Vgs and the threshold voltage Vth may become [(Vdata+Vth+K)−Vth=Vdata+K].

In Equation (1), (Vgs−Vth)² may become (Vdata+K)².

Therefore, in Equation (1), the current Ioled flowing in the organic light emitting diode OLED may be proportional to the square of (Vgs−Vth=(Vdata+Vth+K)−Vth=Vdata+K).

Therefore, the organic light emitting diode OLED may emit light corresponding to the data voltage Vdata irrespective of the shift of the threshold voltage Vth of the driving transistor Tdr.

Hereinafter, features of the present disclosure will be briefly described.

In a related art organic light emitting display device for performing internal compensation, in a compensation operation, a threshold voltage of a driving transistor is sensed, and the sensed threshold voltage is stored in a storage capacitor.

An accuracy of sensing of the threshold voltage is affected by factors which affect a voltage variation of the source of the driving transistor Tdr. For example, an accuracy of sensing of the threshold voltage is determined based on a mobility of the driving transistor Tdr and a level of a capacitance of a capacitor (a storage capacitor or a stabilization capacitor) connected to the source of the driving transistor Tdr.

In an aspect of the present disclosure, the storage capacitance Cst of the capacitor unit 111 connected to the source of the driving transistor Tdr may be selectively controlled, and thus, an accuracy of sensing of the threshold voltage Vth of the driving transistor Tdr is enhanced. Accordingly, a compensation performance of the threshold voltage is improved, and thus, a luminance uniformity of the organic light emitting display panel is enhanced.

To provide an additional description, in an aspect of the present disclosure, a level of the storage capacitance Cst which differently affect a sensing characteristic of the threshold voltage, data holding, and a noise resistance may be changed favorably on each of the operations (for example, the sampling operation, the data writing operation, etc.). Accordingly, a sensing characteristic of the threshold voltage in the sampling operation is enhanced without any reduction in data holding and noise resistance characteristics in the data writing operation.

That is, according to an aspect of the present disclosure, a level of the storage capacitance Cst may be changed favorably on each of the initialization operation, the sampling operation, the data writing operation, and the emission operation applied to internal compensation.

For example, in the data writing period C, a level of the storage capacitance Cst may be high. To this end, the storage transistor Tsw4 may be turned on. Therefore, the first storage capacitance Cst1 based on the first storage capacitor CS1 may constitute the storage capacitance Cst between the first node n1 and the second node n2.

Moreover, in the sampling period B, a level of the storage capacitance Cst may be low. To this end, the storage transistor Tsw4 may be turned off. Therefore, a total sum (Cst=(Cst1×Cst2)/(Cst1+Cst2)) of the first storage capacitance Cst1 and the second storage capacitance Cst2 serially connected to each other may constitute the storage capacitance Cst between the first node n1 and the second node n2. The node capacitance based on the first and second storage capacitors CS1 and CS2 may be less than the first storage capacitance Cst1.

In this case, in the sampling period B, since the storage capacitance Cst between the first node n1 and the second node n2 is reduced, the first node n1 is quickly charged. Therefore, the sampling period B is shortened. Accordingly, internal compensation may be performed even in an organic light emitting display panel having a high resolution or an organic light emitting display panel driven at a high speed.

As described above, according to the aspects of the present disclosure, an accuracy of sensing of the threshold voltage is enhanced, and thus, a luminance uniformity of an organic light emitting display panel is improved.

Moreover, according to the aspects of the present disclosure, the sampling period in which the threshold voltage is sensed is shortened, and thus, in a high-resolution organic light emitting display panel, internal compensation is smoothly performed. Also, according to the aspects of the present disclosure, in an organic light emitting display panel driven at a high speed, internal compensation is smoothly performed.

Moreover, according to the aspects of the present disclosure, in an organic light emitting display panel including a transistor having a low mobility characteristic, internal compensation is smoothly performed. Accordingly, a margin of a characteristic of a transistor for which internal compensation is performed increases.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An organic light emitting display panel comprising:
   a plurality of data lines and a plurality of gate lines crossing each other;
   a plurality of pixels defined at intersections of the plurality of data lines and the plurality of gate lines, and each pixel includes,
   an organic light emitting diode;
   a driving transistor including a source connected to the organic light emitting diode;
   an emission transistor connected between a power supply line and the driving transistor;
   a switching transistor connected between a corresponding data line and a gate of the driving transistor; and
   a capacitor unit connected between a second node connected to the gate of the driving transistor and a first node connected to the source of the driving transistor,
   wherein the capacitor unit has a variable capacitance which is configured to vary based on a storage signal such that in a sampling period in which a threshold voltage of the driving transistor is sensed, the capacitance is lower than in an emission period in which an image is displayed.

2. The organic light emitting display panel of claim 1, wherein the capacitor unit comprises:
   a first storage capacitor having one side connected to the second node;
   a second storage capacitor having one side connected to another side of the first storage capacitor and connected to the first node at another side; and
   a storage transistor connected between the first node and a third node connected to the first storage capacitor and the second storage capacitor.

3. An organic light emitting display device comprising:
   an organic light emitting display panel including a plurality of data lines, a plurality of gate lines, and a plurality of pixels defined by the plurality of data lines and the plurality of gate lines;
   a data driver supplying data voltages to the plurality of data lines;
   a gate driver supplying gate signals to the plurality of gate lines; and
   a controller controlling the data driver and the gate driver,
   wherein each pixel includes,
   an organic light emitting diode;
   a driving transistor including a source connected to the organic light emitting diode;
   an emission transistor connected between a power supply line and the driving transistor;
   a switching transistor connected between a corresponding data line and a gate of the driving transistor; and
   a capacitor unit connected between a second node connected to the gate of the driving transistor and a first node connected to the source of the driving transistor,
   wherein the capacitor unit has a variable capacitance which is configured to vary based on a storage signal input from the gate driver such that in a sampling period in which a threshold voltage of the driving transistor is sensed, the capacitance is lower than in an emission period in which an image is displayed.

4. The organic light emitting display device of claim 3, wherein the capacitor unit comprises:
   a first storage capacitor having one side connected to the second node;
   a second storage capacitor having one side connected to another side of the first storage capacitor and connected to the first node at another side; and
   a storage transistor connected between the first node and a third node connected to the first storage capacitor and the second storage capacitor.

5. The organic light emitting display device of claim 4, wherein the first storage capacitor provides a first storage capacitance during the emission period, and
   the first storage capacitor and the second storage capacitor serially connected to each other provide a node capacitance between the first node and the second node during the sampling period.

6. The organic light emitting display device of claim 4, wherein the first storage capacitor provides a first storage capacitance between the second node and the first node during an initialization period, when the emission transistor is turned off and the storage transistor is turned on.

7. The organic light emitting display device of claim 4, wherein the first and second storage capacitor serially connected to each other provides a node capacitance between the second node and the first node during the sampling period, when the emission transistor is turned on and the storage transistor is turned off.

8. The organic light emitting display device of claim 4, wherein the first storage capacitor provides a first storage capacitance between the first node and the second node during a data writing period, when the emission transistor is turned off and the storage transistor is turned on.

9. The organic light emitting display device of claim 4, wherein the first storage capacitor provides a first storage capacitance between the second node and the first node during the emission period, when the emission transistor is turned on and the storage transistor is turned on.

10. An organic light emitting display panel including a pixel comprising:
an organic light emitting diode;
a driving transistor including a source connected to the organic light emitting diode;
an emission transistor connected between a power supply line and the driving transistor;
a switching transistor connected between a corresponding data line and a gate of the driving transistor; and
a capacitor unit connected between a second node connected to the gate of the driving transistor and a first node connected to the source of the driving transistor,
wherein the capacitor unit has a variable capacitance which is configured to vary based on a storage signal such that in a sampling period in which a threshold voltage of the driving transistor is sensed, the capacitance is lower than in an emission period in which an image is displayed.

11. The organic light emitting display panel of claim 10, wherein the capacitor unit comprises:
a first storage capacitor having one side connected to the second node;
a second storage capacitor having one side connected to another side of the first storage capacitor and connected to the first node at another side; and
a storage transistor connected between the first node and a third node connected to the first storage capacitor and the second storage capacitor.

12. The organic light emitting display panel of claim 11, wherein the first storage capacitor provides a first storage capacitance during the emission period, and
the first storage capacitor and the second storage capacitor serially connected to each other provide a node capacitance between the first node and the second node during the sampling period.

13. The organic light emitting display panel of claim 11, wherein the first storage capacitor provides a first storage capacitance between the second node and the first node during an initialization period, when the emission transistor is turned off and the storage transistor is turned on.

14. The organic light emitting display device of claim 11, wherein the first and second storage capacitor serially connected to each other provides a node capacitance between the first node and the second node during the sampling period, when the emission transistor is turned on and the storage transistor is turned off.

15. The organic light emitting display panel of claim 11, wherein the first storage capacitor provides a first storage capacitance between the first node and the second node during a data writing period, when the emission transistor is turned off and the storage transistor is turned on.

16. The organic light emitting display panel of claim 11, wherein the first storage capacitor provides a first storage capacitance between the second node and the first node during the emission period, when the emission transistor is turned on and the storage transistor is turned on.

\* \* \* \* \*